(12) United States Patent
Wu et al.

(10) Patent No.: US 7,733,675 B2
(45) Date of Patent: Jun. 8, 2010

(54) PWN MODULATOR IN MULTI-PHASE CONVERTER

(75) Inventors: Wenkai Wu, East Greenwich, RI (US); George Schuellein, Narragansett, RI (US)

(73) Assignee: International Rectifier Corporation, El Segundo, CA (US)

( * ) Notice: Subject to any disclaimer, the term of this patent is extended or adjusted under 35 U.S.C. 154(b) by 162 days.

(21) Appl. No.: 11/781,595

(22) Filed: Jul. 23, 2007

(65) Prior Publication Data

US 2008/0019436 A1    Jan. 24, 2008

Related U.S. Application Data

(60) Provisional application No. 60/820,039, filed on Jul. 21, 2006.

(51) Int. Cl.
*H02M 7/00* (2006.01)
*G05F 1/40* (2006.01)

(52) U.S. Cl. ........................... 363/65; 323/271

(58) Field of Classification Search .................. 363/16, 363/17, 56.01, 56.02, 65, 71, 131, 132; 323/222, 323/268, 271, 282, 285

See application file for complete search history.

(56) References Cited

U.S. PATENT DOCUMENTS

| | | | | |
|---|---|---|---|---|
| 6,160,725 A | * | 12/2000 | Jansen | 363/65 |
| 6,188,586 B1 | * | 2/2001 | Farrington et al. | 363/17 |
| 6,600,296 B2 | * | 7/2003 | Hazucha | 323/237 |
| 7,034,511 B2 | * | 4/2006 | Schuellein et al. | 323/272 |

* cited by examiner

*Primary Examiner*—Matthew V Nguyen
(74) *Attorney, Agent, or Firm*—Farjami & Farjami LLP

(57) ABSTRACT

A circuit for preventing inductor saturation during a step-up load transient in a multi-phase converter circuit where phases are turned ON sequentially by a shared clock signal with a fixed phase shift, each phase having high- and low-side switches series connected at a switching node, the circuit including at least one closed loop connected to at least one phase for providing ripple current cancellation in input and output sides of the multi-phase converter circuit; an oscillator circuit for providing a signal to turn ON and OFF the high- and low-side switches of each of the phases of the multi-phase converter circuit; and a detection circuit to detect the transient. The detect circuit includes an error amplifier circuit to receive input signals from an output of the multi-phase converter and to provide an error signal; and a clock oscillator frequency changing circuit receiving the error signal for increasing the clock oscillation frequency when said detection circuit detects a step-up load transient.

19 Claims, 6 Drawing Sheets

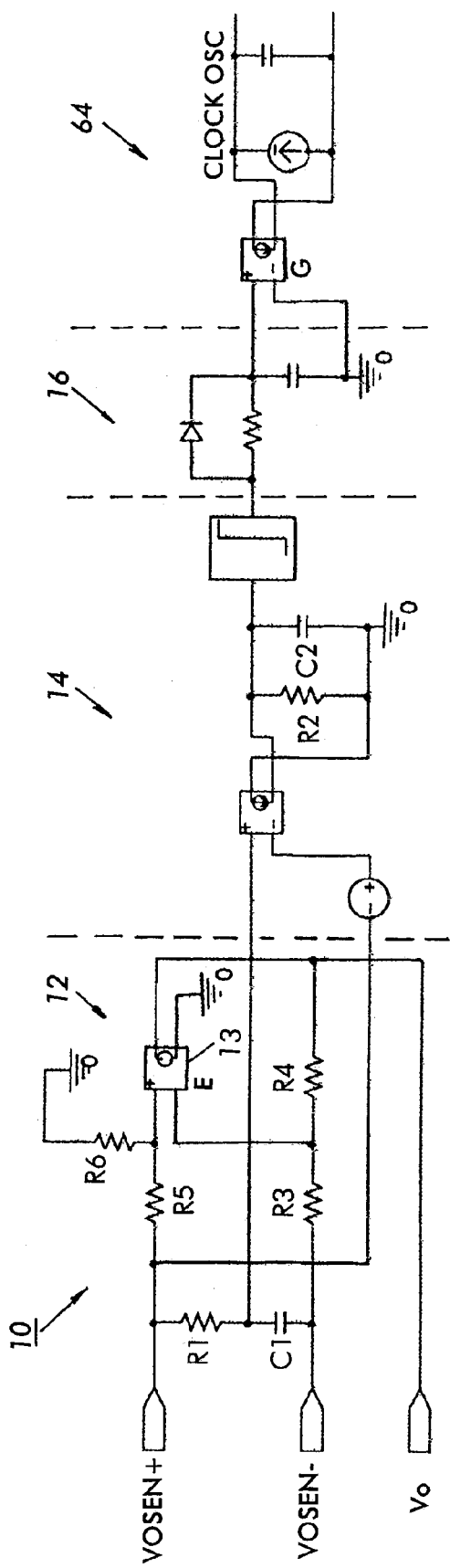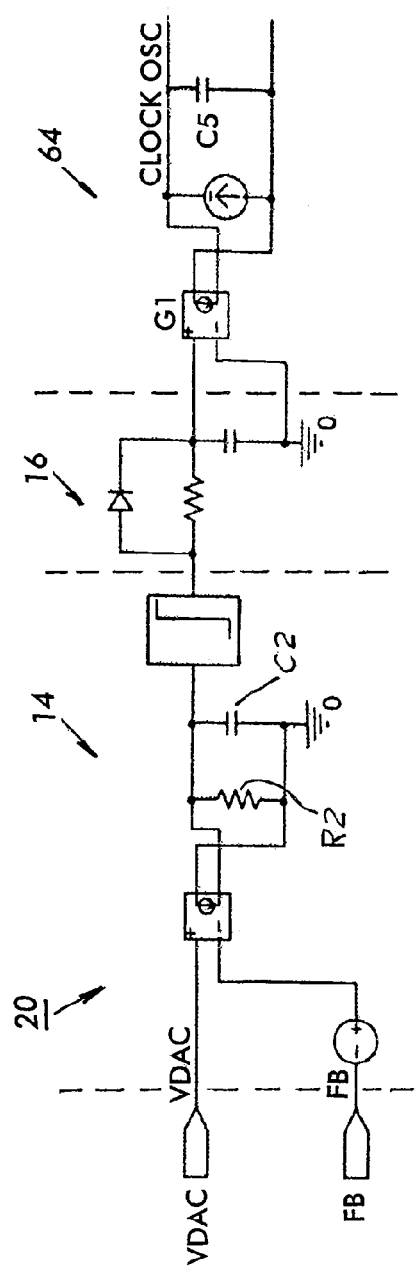
FIG.2b
FIG.2c (WITH RAMP MODULATION)

(WITHOUT RAMP MODULATION)

PWN MODULATOR IN MULTI-PHASE CONVERTER

CROSS-REFERENCE TO RELATED APPLICATION

This application is based on and claims priority to U.S. Provisional Patent Application Ser. No. 60/820,039, filed on Jul. 21, 2006 and entitled PWM MODULATOR IN MULTI-PHASE CONVERTER, the entire disclosure of which is hereby incorporated by reference.

BACKGROUND OF THE INVENTION

The present invention relates to multi-phase converters and more particularly to current sharing among phases in the multi-phase converters.

FIG. 1 illustrates a representative circuit topology for a multi-phase converter designated generally at 2. This includes a plurality of interleaving output phases 5a, 5b, 5c, . . . , 5n, a multi-phase converter control circuit 3, and a feedback circuit (not shown) of any suitable design, as will be understood by those skilled in the art. Each output phase includes a high-side switch, a low-side switch, and an output inductor, La, Lb, Lc, . . . , Ln. An output capacitor C is connected to the output inductors L and a load 7.

Normally, to pursue the best ripple current cancellation in both input and output sides of the multi-phase converter, such as in FIG. 2, each phase, i.e., phases 5a, 5b, 5c, . . . , 5n, is turned ON sequentially with a fixed phase shift. In several implementations, these phases 5 form a close loop and are turned ON sequentially by a shared clock signal.

Likewise, a current share bus of the multi-phase converter is normally implemented to achieve current balance or current sharing among the phases and a current share loop bandwidth is far below the outmost voltage loop bandwidth. Due to the slow current share loop in such multi-phase converters, one phase may receive a very high current and its inductor will be saturated during load transient. Use of current sharing and current share loops is well known and will be understood by those skilled in the art. A discussion of the current share loop may be found, for example, in U.S. Pat. No. 6,912,144 to Clavette.

SUMMARY OF THE INVENTION

It is an object of the present invention to provide better current sharing and less loop gain change for the multi-phase converter.

A circuit is provided for preventing inductor saturation during a step-up load transient in a multi-phase converter circuit where phases are turned ON sequentially by a shared clock signal with a fixed phase shift, each phase having high- and low-side switches series connected at a switching node, the circuit including at least one closed loop connected to at least one phase for providing ripple current cancellation in input and output sides of the multi-phase converter circuit; an oscillator circuit for providing a signal to turn ON and OFF the high- and low-side switches of each of the phases of the multi-phase converter circuit; and a detection circuit to detect the transient. The detect circuit includes an error amplifier circuit to receive input signals from an output of the multi-phase converter and to provide an error signal; and a clock oscillator frequency changing circuit receiving the error signal for increasing the clock oscillation frequency when said detection circuit detects a step-up load transient.

Other features and advantages of the present invention will become apparent from the following description of the invention that refers to the accompanying drawings.

BRIEF DESCRIPTION OF THE DRAWINGS

FIGS. 2b and 2c are circuits used to detect the transient and to modulate a clock frequency;

DETAILED DESCRIPTION OF EMBODIMENTS OF THE INVENTION

Figure 1:
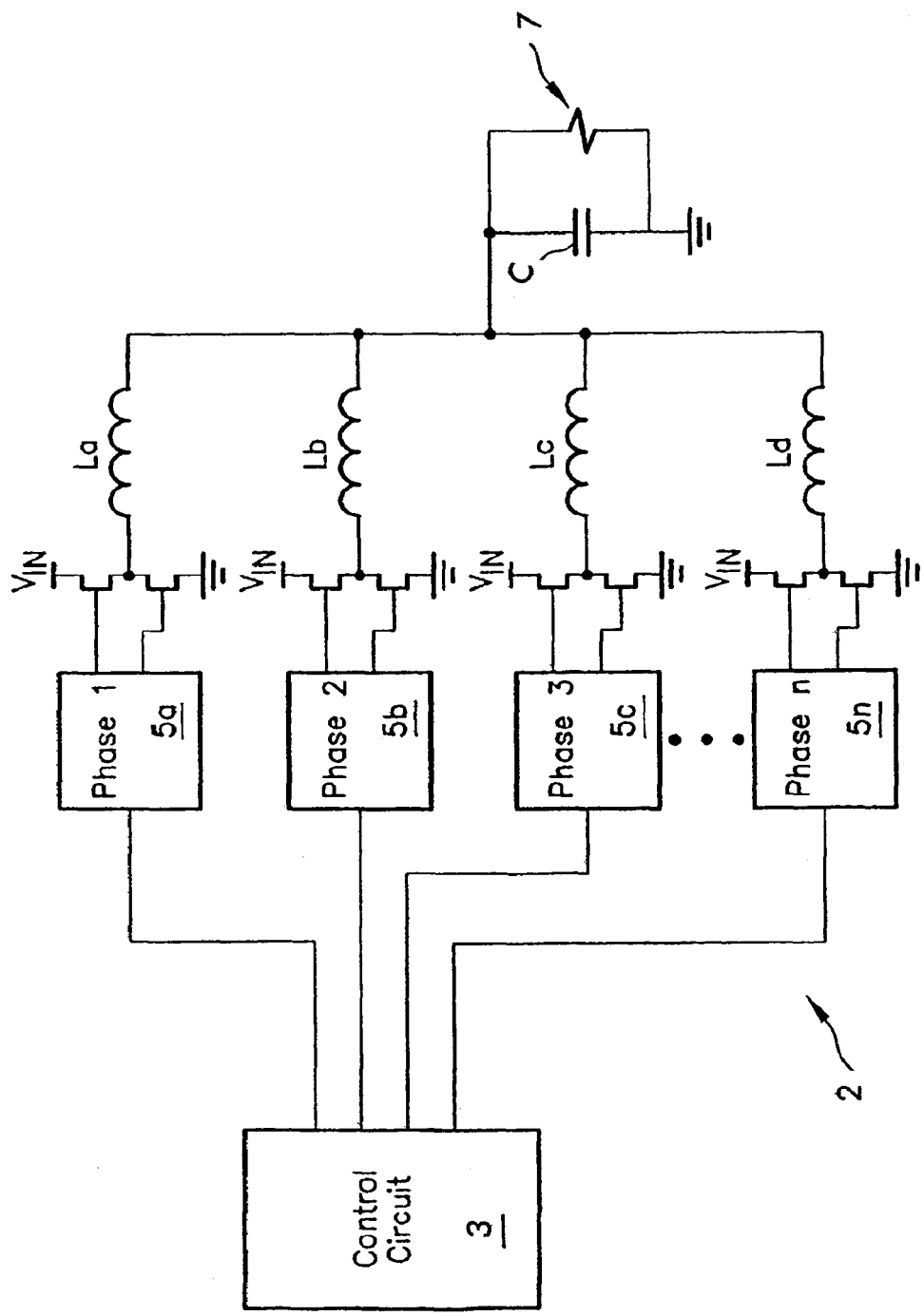
FIG. 1 is a representative circuit topology for a multi-phase converter.
Figure 2A:
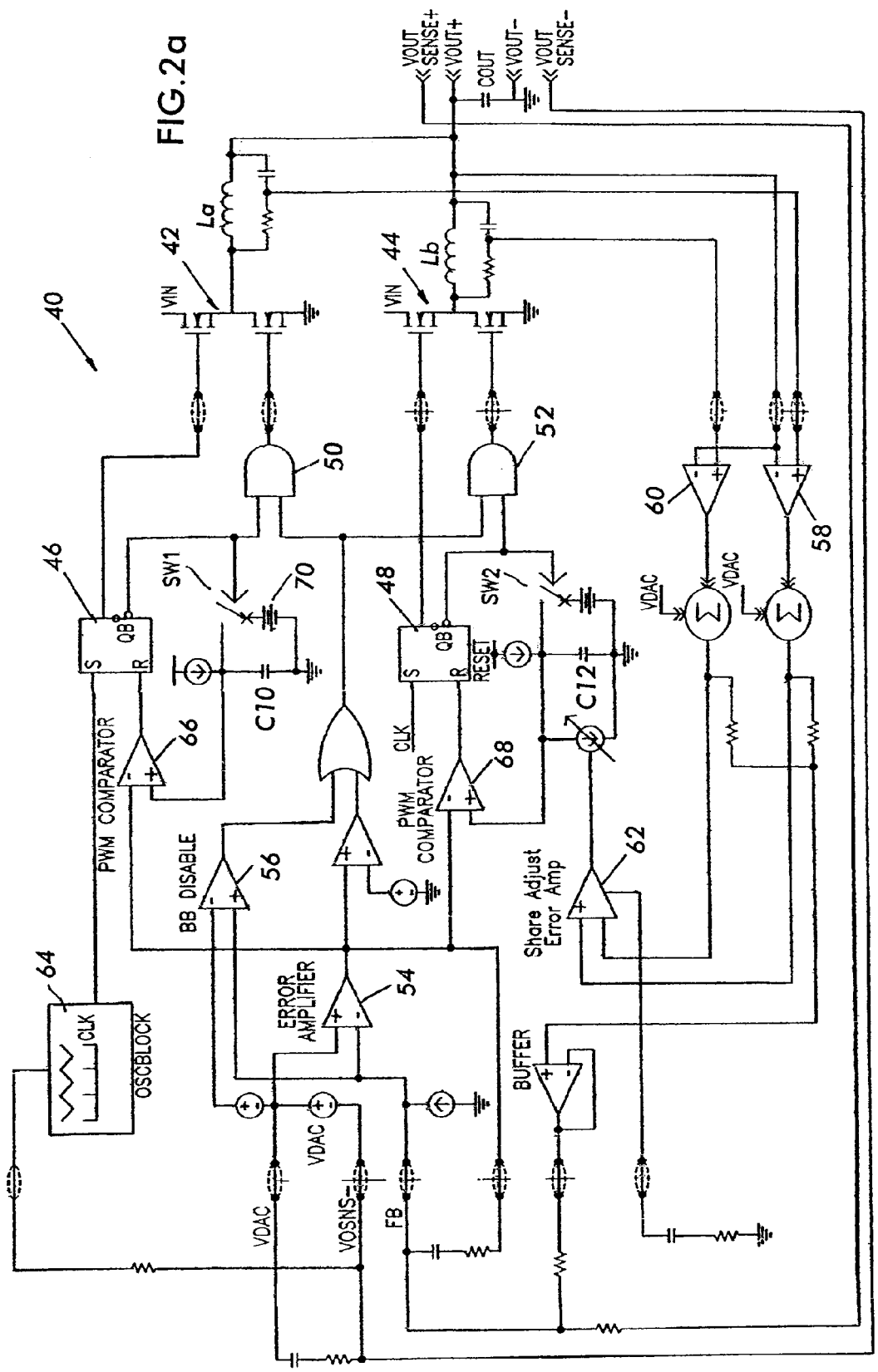
FIG. 2a is a block diagram of an exemplary multi-phase converter circuit including two phases.

For illustrative purposes, FIG. 2a shows a two-phase converter 40 that includes switching stages 42 and 44 each having high- and low-side switches. Power to the stages 42 and 44 is provided at VIN from a suitable power source, typically a battery or an AC-DC transformer/rectifier. The high side and low side switches are driven respectively by outputs from flip-flops 46 and 48 and corresponding AND circuits 50 and 52.

Each stages 42 and 44 is arranged in a half bridge arrangement with a common connection being provided to respective output inductors La and Lb. The other ends of inductors La and Lb are coupled together at a common output node $V_{OUT}+$. The output is taken across an output capacitor $C_{OUT}$ coupled between $V_{OUT}+$ and ground ($V_{OUT}-$). The output voltage is sensed between $V_{OUT}$SENSE+ and $V_{OUT}$SENSE− which are respectively applied to a feedback FB input and VOSNS− inputs to error amplifiers 54 and 56 respectively. The feedback FB input is provided to an inverting input of the error amplifier 54, while its other, non-inverting input is coupled to a voltage reference VDAC. A closed loop is provided for each phase by current senses to error amplifiers 58 and 60 respectively and then to an error amplifier 62.

The circuit 40 includes a programmable oscillator circuit 64, which generates an internal sawtooth signal provided as timing pulse signals to set the phase 42 and phase 44 RS Flip Flops 46 and 48. Furthermore, a respective ramp voltage is provided to respective PWM comparators 66 and 68 at their non-inverting inputs. An output from the error amplifier 54 is provided to the inverting inputs of each of the PWM comparators. The PWM comparator 66 is provided with a fixed slope ramp voltage provided by a current charging through a capacitor C10 from a current source 70 when a switch SW1 is opened. Likewise, in the other phase controlled by flip flop 48, the low side driver is turned off and the high side driver turned on upon receiving a clock pulse and a capacitor C12 begins to charge when a switch SW2 is opened by the QB output of flip flop 48.

When a load current $V_{OUT}$ steps up, the clock frequency speeds up and more phases are possibly introduced to power the load. Therefore, fewer output capacitors may be used in the system to reduce the solution cost. Furthermore, during the transient, since unlike one-phase converters, multi-phase converters take the load current, better current sharing may be expected.

However, if pulse width modulation (PWM) pulses are terminated and several phases overlap, thereby introducing overshoot, the system may experience oscillation. The present invention allows several phases to overlap. The phases, if they have not already been terminated by the PWM comparator, are terminated by a clock in a chain. Additionally, the ramp slopes may be manipulated or kept unchanged to further improve performance.

In a nutshell, the present invention is aimed to speed up the clock in the event of a step-up load transient or increased load current. This will bring more phases in line more quickly. When the clock frequency is increased, some phases may come on at the same time causing overshoot, i.e., output voltage increases too rapidly and goes too high. This can cause oscillation as the feedback loop responds. To handle this, the overlapped phases are terminated. Also, the ramp to the PWM capacitor may be manipulated or kept unchanged FIG. 2b illustrates a circuit 10 used to detect and manage the transient. The circuit 10 can be integrated, for example, in the circuit 40 of FIG. 2a to receive voltages $V_{OUT}$SENSE+, $V_{OUT}$SENSE−, and $V_{OUT}$ as input and provide its output as input to the clock oscillator circuit 64. The circuit 12 includes series connected resistor R1 and capacitor C1, the resistor R1 is further connected to a resistor R5 to form a voltage divider and the capacitor C1 is connected to a resistor R3, which is series connected to a resistor R4. The resistor R5 further forms another voltage divider with a resistor R6, which is connected to the ground. The voltage $V_{OUT}$SENSE+ is received at the connection of the resistors R1 and R5. The voltage $V_{OUT}$SENSE− is received at the connection of the Capacitor C1 and the resistor R3. The voltage $V_{OUT}$ is received at a second terminal of the resistor R4 and an amplifier 13. The amplifier 13 is further coupled at the connections of resistors R3 and R4 and resistors R5 and R6.

In accordance with the present invention, an input circuit 12 delivers a voltage signal RC from a common node of the series connected resistor R1 and capacitor C1, the RC voltage signal is provided at a positive terminal of a differential error amplifier circuit 14. A signal to the negative terminal of a negative terminal of a differential error amplifier circuit 14 is provided from the voltage divider formed by the resistors R1 and R5.

In the circuit 14, based on the voltage across the resistor R2 that is parallel coupled with a capacitor C2, the transient and its amplitude are determined. A fixed offset may be introduced in a circuit 16 to eliminate the noise and a steady-state output ripple.

FIG. 2c illustrates a circuit 20, which differs with the circuit 10 only in that as in the voltage error amplifier 54, the input to the differential error amplifier circuit 14, which determines the transient and its amplitude, is provided as the feedback FB input and the voltage reference VDAC. Thus, the error amplifier circuit 14 determines the voltage difference between its invert (FB) and non-invert (VDAC) pins.

Figure 3A:
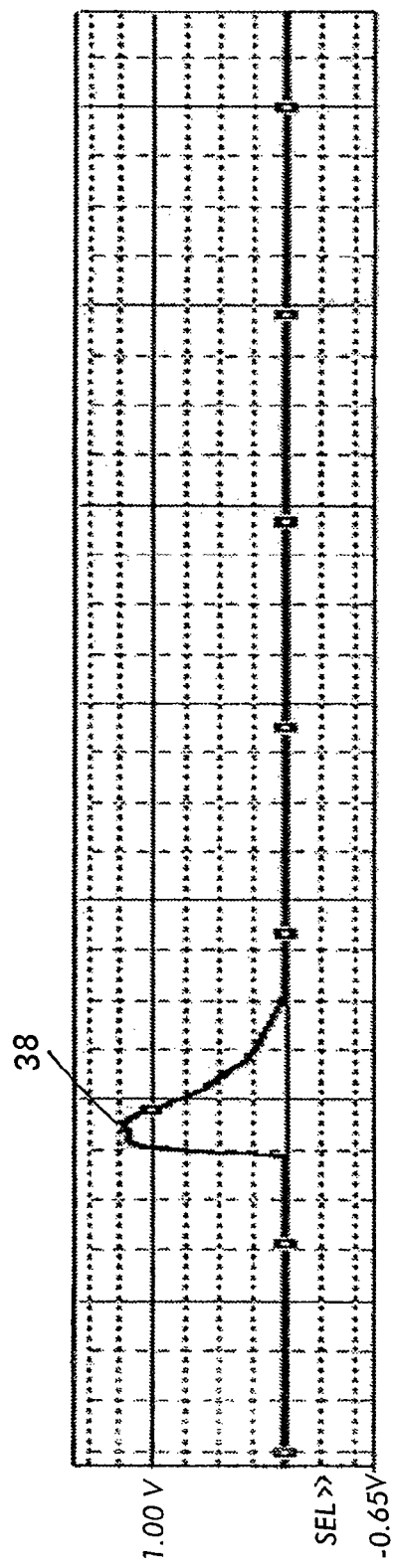
FIGS. 3a and 3b are graphs showing detection of the transient and modulation of the clock frequency.
Figure 3B:
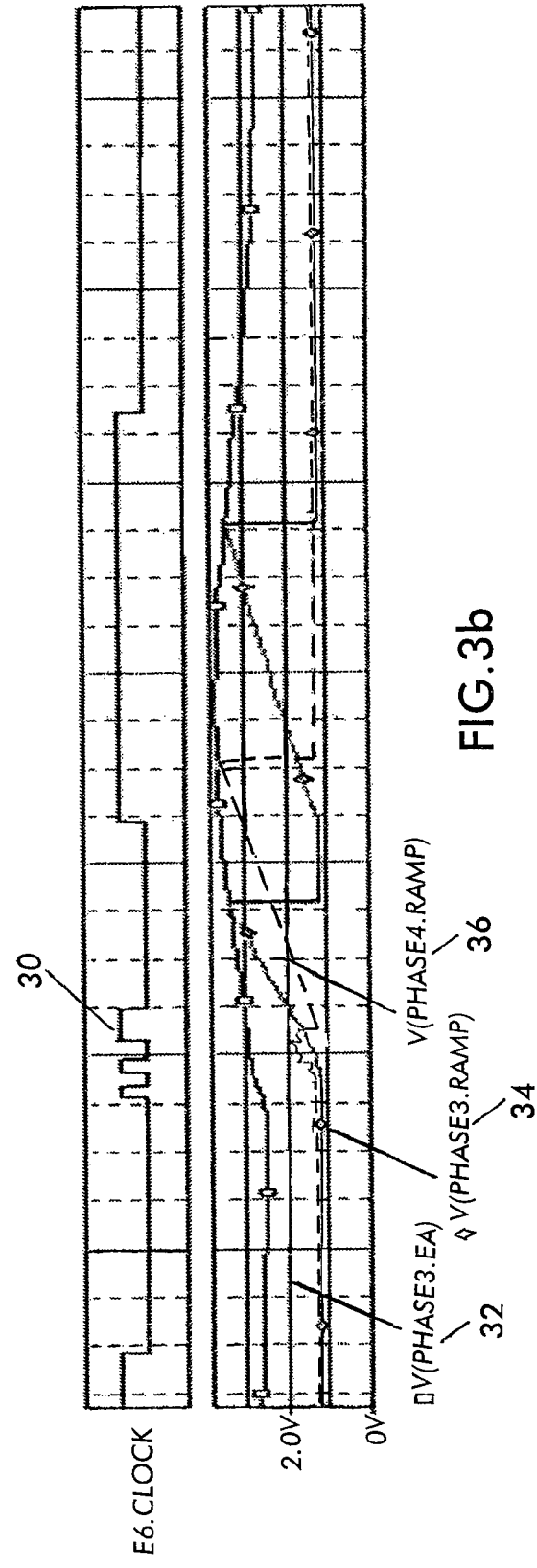

After the transient is detected, a clock frequency is accelerated immediately by the clock oscillator circuit 64, but as shown in FIGS. 3a and 3b, the clock frequency is allowed to decay relative to a certain, predetermined time constant. Due to the clock frequency acceleration 30, more phases 32, 34, and 36 may be introduced to power the load. This, therefore, leads to use of fewer output capacitors in the multi-phase converter circuit, thereby reducing the cost of such circuit.

Furthermore, during the transient 38, since unlike the one phase converters, the multi-phase converters receive the load current, better current sharing may be expected. However, if PWM pulses are terminated and several phases overlap, the system may experience oscillation since overshoots are introduced at this moment.

Figure 4A:
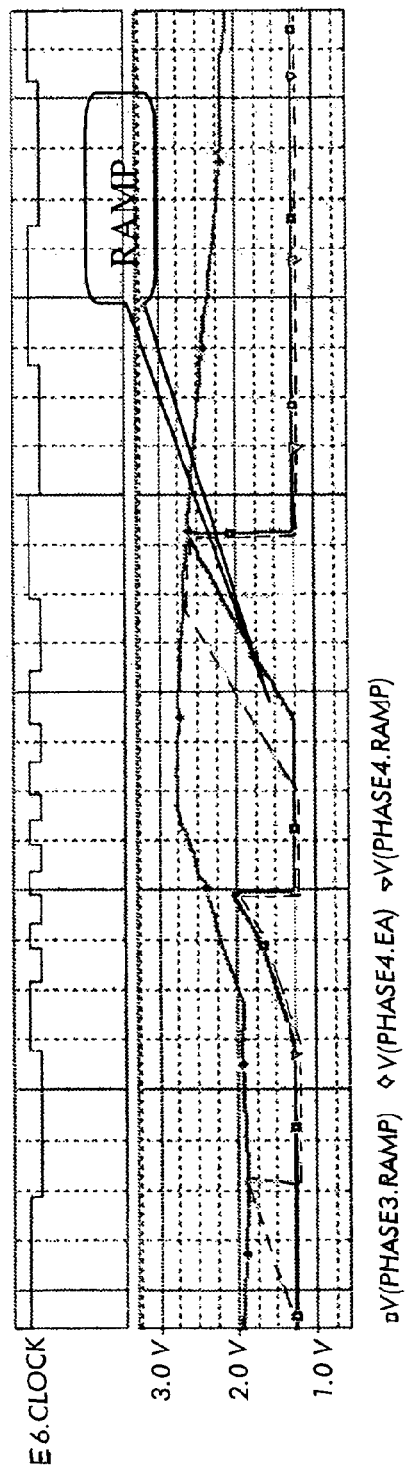
FIGS. 4a and 4b are graphs showing detection of the transient and modulation of a clock frequency with ramp modulation (FIG. 4a) and without any modulation (FIG. 4b).
Figure 4A:
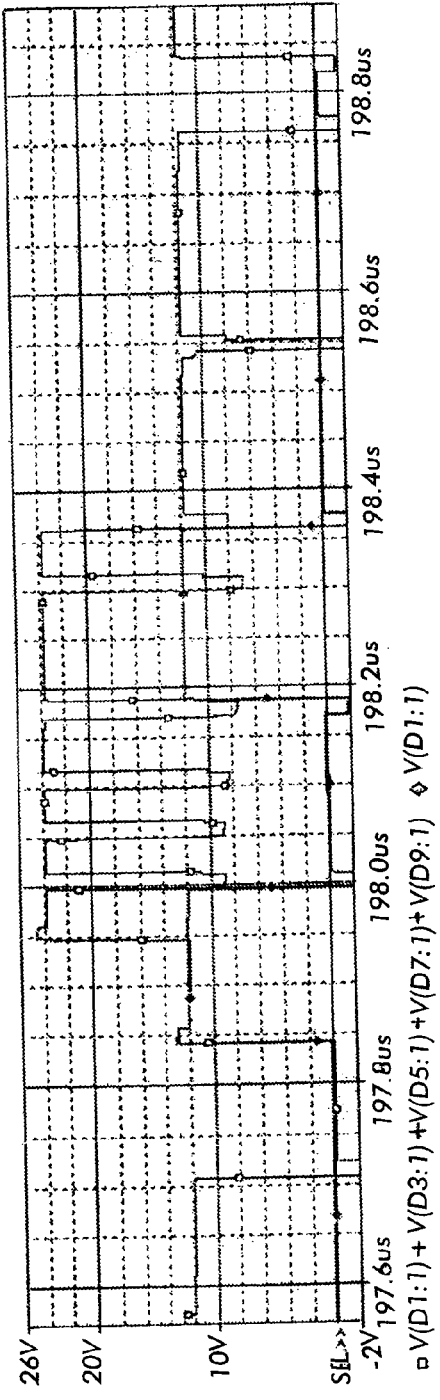
Figure 4B:
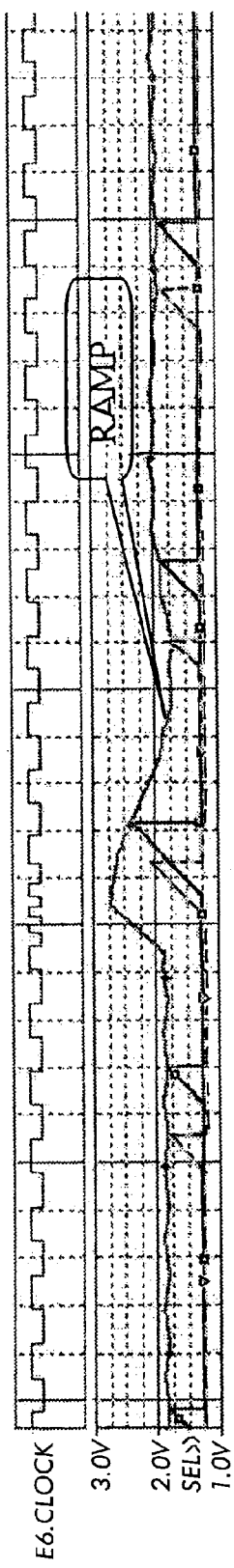
Figure 4B:
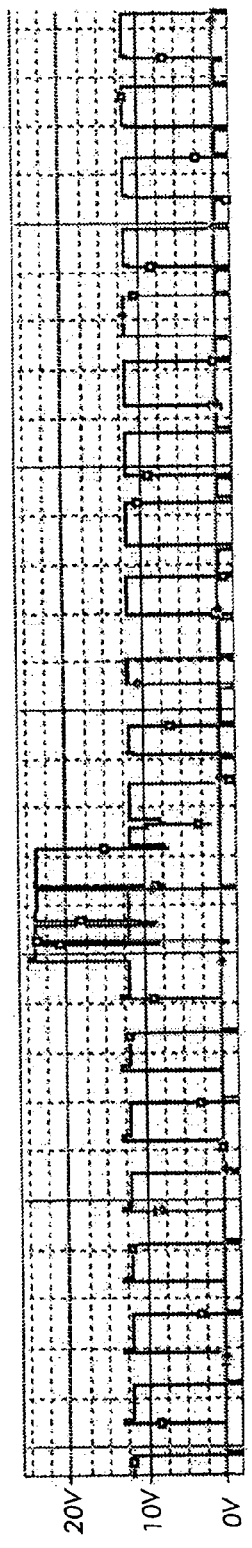
Figure 4B:
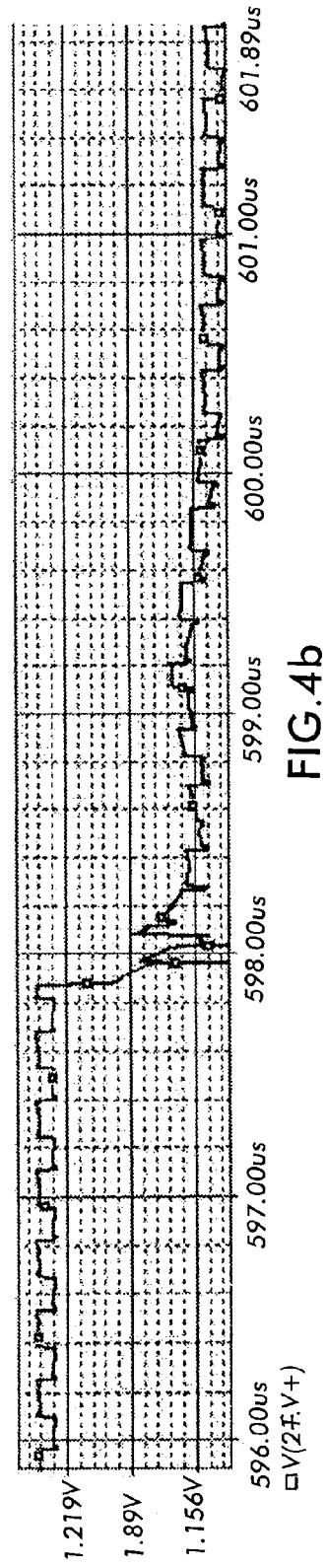

The present invention allows overlap of several phases, with the phase(s) being terminated by a clock in a chain if the phase(s) have not already been terminated by the PWM comparator. Additionally, the ramp slopes may be kept unchanged, as shown in FIG. 4(a) or manipulated, as shown in FIG. 4(b) to further improve the system performance.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A circuit for preventing inductor saturation during a step-up load transient in a multi-phase converter circuit where phases are turned ON sequentially by a shared clock signal with a fixed phase shift, each phase having high- and low-side switches series connected at a switching node, the circuit comprising:
   at least one closed loop connected to at least one phase for providing ripple current cancellation in input and output sides of the multi-phase converter circuit;
   an oscillator circuit for providing a signal to turn ON and OFF the high- and low-side switches of each of the phases of the multi-phase converter circuit; and
   a detection circuit to detect the transient, the detect circuit comprising:
      an error amplifier circuit to receive input signals from an output of the multi-phase converter to provide an error signal; and
      a clock oscillator frequency changing circuit receiving the error signal for increasing the clock oscillation frequency when said detection circuit detects a step-up load transient.

2. The circuit of claim 1, wherein the detect circuit further comprises an input circuit for receiving the voltage input signals from positive and negative terminals of a load and an output voltage.

3. The circuit of claim 1, wherein the voltage input signals received by the detect circuit include a feed back voltage as a negative input and a reference voltage as a positive input.

4. The circuit of claim 1, wherein the detect circuit further comprises an offset circuit to introduce a fixed offset to eliminate noise and a steady-state output ripple.

5. The circuit of claim 1, wherein better current sharing is obtained and the loop gain is decreased.

6. The circuit of claim 1, wherein PWM pulses are generated to turn ON and OFF the high and low side switches, and if the PWM pulses are terminated, phase overlap will not cause an overshoot or oscillation when the clock frequency is increased.

7. The circuit of claim 1, wherein, if the phases have not been terminated by the PWM comparator, a clock of the oscillator circuit terminates the not-terminated phases.

8. The circuit of claim 7, wherein, the clock frequency is allowed to decay relative to a predetermined time constant thereby introducing more power to the load.

9. The circuit of claim 8, wherein when a load current increases, the clock frequency is increased introducing more phases to power the load, wherein the multi-phase converter circuit thereby requires fewer capacitors.

10. The circuit of claim 9, wherein overlap of several phases in the multi-phase converter circuit is permitted as part of normal operation.

11. The circuit of claim 1, wherein the detection circuit further comprises a ramp circuit to manage ramp slopes to improve performance of the multi-phase converter circuit, wherein, the management entails the manipulation of the ramp slopes and keeping the ramp slopes unchanged.

12. An inductor saturation reduction circuit for reducing inductor saturation during a step-up load transient in one of a plurality of phases of a multi-phase converter circuit with a clock oscillator frequency, said inductor saturation reduction circuit comprising:

a sensor to sense a current in a phase of the multi-phase converter circuit;

a control circuit located in a closed loop between said sensor and said multi-phase converter, wherein said control circuit is configured to provide ripple cancellation to said multi-phase converter circuit;

wherein said control circuit increases the clock frequency of said multi-phase converter if said sensor senses a step-up load, or if said sensor detects an increase in said current in said multi-phase converter circuit.

13. The inductor saturation reduction circuit of claim 12, wherein said sensor comprises at least one amplifier.

14. The inductor saturation reduction circuit of claim 12, wherein said sensor comprises an offset circuit to transmit a fixed offset to said control circuit.

15. The inductor saturation reduction circuit of claim 12, wherein said sensor comprises a ramp circuit capable of being manipulated to improve the performance of said inductor saturation reduction circuit.

16. The inductor saturation reduction circuit of claim 12, wherein:

at said one of a plurality of phases of said multi-phase converter comprises a high-side switch and a low-side switch;

said control circuit is capable of turning ON and turning OFF said high-side switch and said low-side switch.

17. The inductor saturation reduction circuit of claim 12, wherein said control circuit comprises an oscillator, and said oscillator is configured to turn ON and OFF said high-side switch and said low-side switch of said one of a plurality of phases of said multi-phase converter.

18. The inductor saturation reduction circuit of claim 12, wherein said control circuit comprises a PWM comparator and an oscillator capable of terminating a signal corresponding to said one of a plurality of phases of said multi-phase converter.

19. The inductor saturation reduction circuit of claim 12, wherein said control circuit comprises a PWM comparator and an oscillator, and wherein:

said oscillator terminates a signal corresponding to said one of a plurality of phases of said multi-phase converter if said signal is not terminated by said PWM comparator;

said clock oscillator frequency is allowed to decay relative to a predetermined time constant.

* * * * *

UNITED STATES PATENT AND TRADEMARK OFFICE
CERTIFICATE OF CORRECTION

| | | |
|---|---|---|
| PATENT NO. | : 7,733,675 B2 | |
| APPLICATION NO. | : 11/781595 | |
| DATED | : June 8, 2010 | |
| INVENTOR(S) | : Wu et al. | |

It is certified that error appears in the above-identified patent and that said Letters Patent is hereby corrected as shown below:

Title Page, Item (54) and at Column 1, line 1,

In the title, "PWN" should be changed to --PWM--.

In the claims, column 5, line 1, "wherein, the" should be changed to --wherein the--.

Signed and Sealed this
Twenty-ninth Day of November, 2011

David J. Kappos
*Director of the United States Patent and Trademark Office*